(12) United States Patent
Markovich et al.

(10) Patent No.: US 6,291,776 B1
(45) Date of Patent: *Sep. 18, 2001

(54) THERMAL DEFORMATION MANAGEMENT FOR CHIP CARRIERS

(75) Inventors: Voya R. Markovich, Endwell; Peter A. Moschak, Chenango Forks; Seungbae Park, Ithaca; Sanjeev B. Sathe, Johnson City, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/185,425

(22) Filed: Nov. 3, 1998

(51) Int. Cl.[7] ..................................................... H05K 1/11
(52) U.S. Cl. ........................ 174/262; 174/266; 257/669; 257/698
(58) Field of Search ................................. 174/262, 266; 29/852; 361/748, 750; 257/668, 698, 669

(56) References Cited

U.S. PATENT DOCUMENTS

| | | | |
|---|---|---|---|
| 4,674,182 | 6/1987 | Igarashi | 29/837 |
| 5,264,664 | 11/1993 | McAllister et al. | 174/261 |
| 5,293,067 | * 3/1994 | Thompson et al. | 257/668 |
| 5,412,538 | * 5/1995 | Kikinis et al. | 174/262 |
| 5,451,720 | 9/1995 | Estes et al. | 174/250 |
| 5,473,813 | 12/1995 | Chobot et al. | 29/837 |
| 5,600,884 | 2/1997 | Kondo et al. | 29/852 |

FOREIGN PATENT DOCUMENTS 60-16701    1/1985    (JP) .

* cited by examiner

Primary Examiner—Albert W. Paladini
(74) Attorney, Agent, or Firm—Scully, Scott, Murphy & Presser; Ronald A. Kaschak

(57) ABSTRACT

A chip carrier constituted of an organic laminate which incorporates structure compensating for thermal deformation of the carrier. Moreover, disclosed is a method of counteracting the thermal deformations encountered by chip carriers, especially during solder reflow, which is predicated on the uniformly, equidistant positioning of metal-plated through-holes (PTH) formed in the chip carrier relative to contact pads. A plurality of plated through-holes (PTH) are positioned equidistantly relative to contact (BGA) pads on a surface of a substrate which is constituted of an organic laminate material, so as to be able to control both in-plane and out-of-plane thermal deformations in the chip carrier material which may be occasioned in a solder reflow furnace or oven.

12 Claims, 6 Drawing Sheets

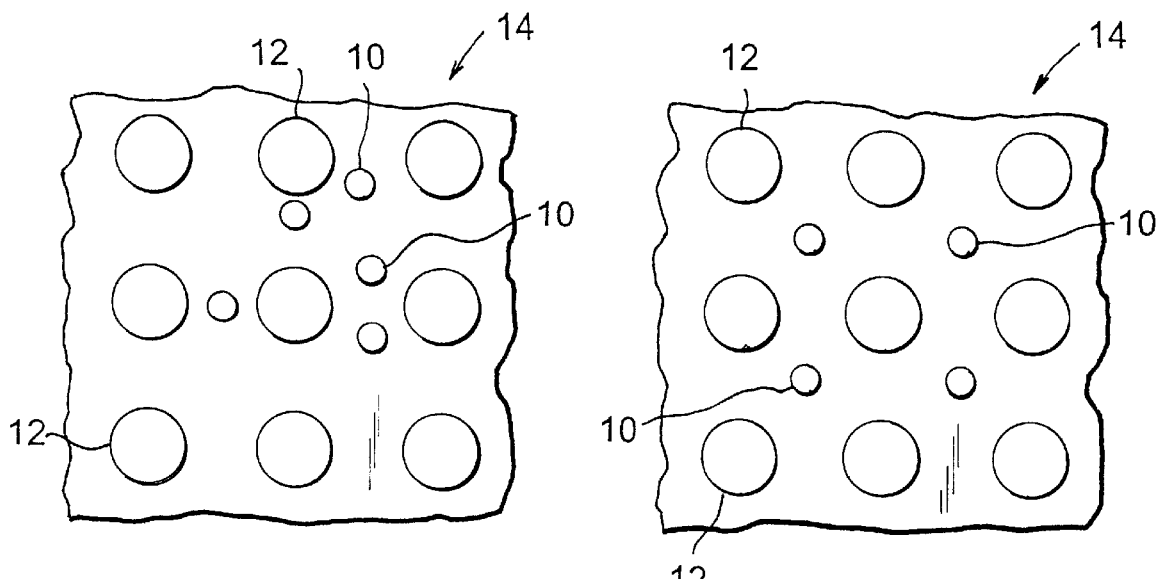
FIG. 1
(Prior Art)
FIG. 2
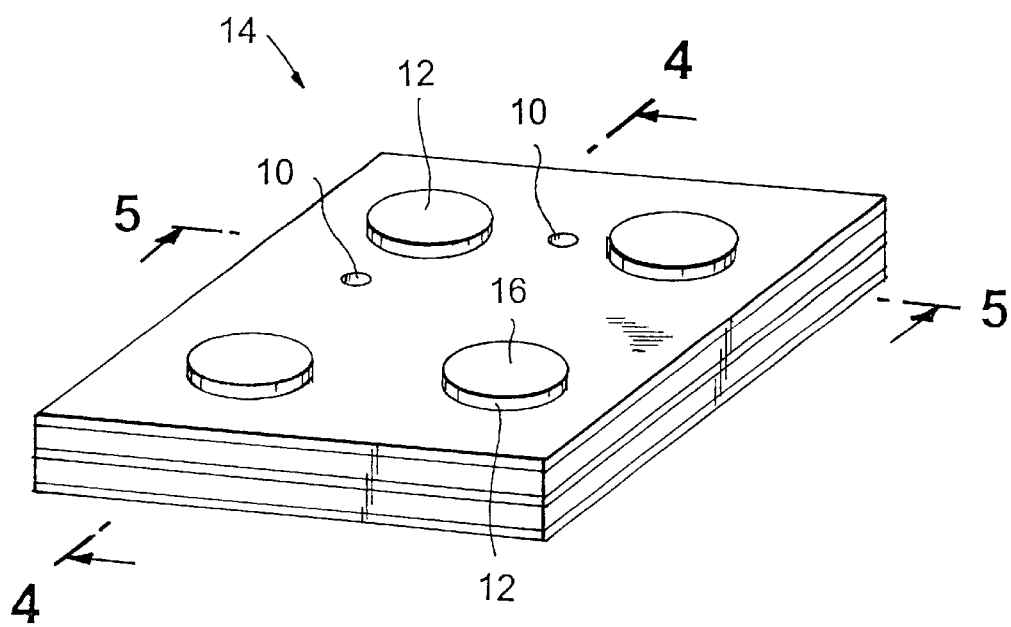
FIG. 3

Comparison: G-4 vs L-4

○ G-4 is in the symmetric location of L-4
○ L-4 shows about 3 times higher BGA failure
○ Although G-4 has more PTHs(4) around its pad, it constructs symmetry while H-4 does not.

THERMAL DEFORMATION MANAGEMENT FOR CHIP CARRIERS

BACKGROUND OF THE INVENTION

The present invention relates to a chip carrier, and more particularly, pertains to a chip carrier constituted of an organic laminate which incorporates structure compensating for thermal deformation of the carrier. Moreover, the invention relates to a method of counteracting the thermal deformations encountered by chip carriers, especially during solder reflow, which is predicated on the positioning of metal-plated through-holes (PTH) formed in the chip carrier.

In considering the structure of chip carriers, such as flip chip attach carriers, especially those which are constituted of organic laminates, the positioning of the plated through-holes (PTH) which provide for electrical interconnections between different printed circuit layers, the mismatch which is present in the thermal expansion (CTE) between the plated through-holes, in which the metal plating in the holes normally comprises copper, and the organic laminate material of the printed circuit board (PCB) or carrier, frequently results in both in-plane and out-of-plane thermal deformations of the carrier during solder reflow operations, which have an adverse effect on the reliability of the electrical connects at the locations of ball grid array (BGA) pads. In essence, the irregular or random spacings of the plated through-holes (PTH) with regard to the ball grid array (BGA) pads has evidenced that the closer the proximity of the plated through-hole to a BGA pad, this considerably increases the thermal deformation of the chip carrier at the location of the pad, adversely affecting product reliability through potential failures of the electrical connections at the pad position as a consequence of warpage of the organic material of the chip carrier.

Although publications presently address themselves to various problems associated with different types of arrangements of through-holes and vias extending through chip carriers, these generally do not concern themselves with compensating for thermal deformation stresses or strains tending to deform chip carrier, especially during solder reflow due to differentials or mismatches in the thermal expansion (CTE) which are present between the plated through-holes (PTH) and that of the organic laminate material of the chip carrier having the BGA pads thereon.

DISCUSSION OF THE PRIOR ART

Estes, et al., U.S. Pat. No. 5,451,720 which discloses a printed circuit board incorporating a thermal relief pattern in the form of a plurality of through-holes surrounding a via which is constructed to pass through a substrate consisting of an essentially organic laminate. Although the plurality of apertures define a thermal relief pattern, there is no disclosure of employing predetermined arrangements of plated through-holes for controlling deformations produced in the substrate by mismatches in the thermal expansion (CTE) between plated through-holes and organic laminate chip carrier which would have a tendency to adversely affect the integrity of electrical connections at ball grid array (BGA) pads located on the surface of the chip carrier.

Kondo, et al., U.S. Pat. No. 5,600,884 discloses a method of manufacturing electrical connecting members which incorporate recesses in spaced relationship with through-holes and electrically conductive elements extending therethrough. The recesses are positioned equidistantly intermediate the electrical connecting members and are arranged so as to reduce thermally generated stresses which could conceivably damage or sever the electrically conductive members. Chobot, et al., U.S. Pat. No. 5,473,813 discloses methods for the forming of electronic multi-layer printed circuit boards or cards and of an electronic packages incorporating the foregoing structures. Although the circuit boards incorporate through-holes in order to provide at least one thermal relief passage, there is no disclosure of correlating the positioning of plated through-holes (PTH) relative to ball grid array (BGA) pads on an organic laminate chip carrier so as to compensate for differentials in thermal expansion (CTE) pending to warp or deform the chip carrier and cause possible damage to the electrical interconnections and adversely affect their operative reliability.

McAllister, et al., U.S. Pat. No. 5,264,664 is directed to programmable chip to circuit board connections wherein apertures are provided so as to be able to accommodate connections forming a module.

Igarashi, U.S. Pat. No. 4,674,182 discloses the utilization of dummy patterns in order to prevent the warping of a printed circuit board component caused by uneven stresses which are generated through differences in thermal coefficients of expansion between the various employed materials.

Finally, Japanese Patent Publication No. 60-16701 discloses an electrically stable microwave printed circuit board having pin terminals shielded by providing through-hole structure adjacent thereto.

Although the foregoing publications are to varying degrees indirectly or directly concerned with stress relieving arrangements, and in some instances, those caused by mismatches in the thermal expansions (CTE) between electrical components or metallic components and organic laminate material chip carriers, none of these concern themselves with correlating the positioning of plated through-holes (PTH) relative to pads on an organic laminate chip carrier wherein the pads support ball grid arrays (BGA) so as to take into consideration thermal deformations of the organic laminate chip carrier during solder reflow processes, which are caused by mismatches in the coefficients or extent of thermal expansion (PTH) of the metallic-plated through-holes and the BGA pads positioned at predetermined spacings relative thereto.

SUMMARY OF THE INVENTION

Accordingly, in order to compensate for adverse thermal deformations of organic laminate chip carriers as presently encountered in the prior art, the invention is basically directed through the employment of novel arrangements and methods to solving the problems encountered in the effects of thermally-generated stresses and strains due to encountered by BGA pads the location relative thereto of plated through-holes (PTH) in chip carriers, wherein the carriers are generally of an organic laminate material and the ball grid array (BGA) pads are located in proximity to the plated through-holes. Basically, due to the presence of a mismatch in the coefficients or extent of thermal expansion (CTE) between the plated through-holes, the latter of which may be plated with copper or similar alloy materials, an investigation has evidenced thay by controlling the uniformity in the positioning or spacing of the plated through-holes (PTH) relative to the locations of the BGA pads on the organic laminate carrier, thermal deformations at the site of the pads can be controlled or eliminated so as to provide for a higher degree of reliability and long-term integrity of the electrical connections at those pad positions.

In order to accomplish the foregoing, pursuant to the present invention, a plurality of plated through-holes (PTH)

are positioned equidistantly relative to contact (BGA) pads on a surface of a substrate which comprises an organic laminate material, so as to be able to control both in-plane and out-of-plane thermal deformations in the chip carrier material which may be occasioned in a solder reflow furnace or oven. The equidistant positioning of the plated through-holes relative to the BGA pads in comparison with the presently conventional random or irregularly spaced placement of the plated through-holes in the organic chip carrier has evidenced a significant improvement in the distribution and resultant reduction of stresses and strains generated caused by the differentials in the coefficients or extent of thermal expansion (CTE) between the plated through-holes and the organic chip carrier material supporting the BGA pads.

Accordingly, it is an object of the present invention to provide a chip carrier which comprises a substrate constituted of an organic material and which supports at least two contact pads on a first surface with solder elements disposed on the contact pads; and at least one hole which is a plated through-hole extending substantially through the substrate with the hole being located essentially equidistantly between the two contact pads.

A further object of the present invention resides in the provision of an organic laminate chip carrier which incorporates at least two pads for ball grid arrays (BGA) and plated through-holes (PTH) arranged in symmetrically spaced positioning relative to the BGA pads so as to provide improved and reduced stress and strain relationship at the pads thereby increasing the reliability of electrical elements and contact connections by an avoidance of deformations at the pad locations.

A still further object of the present invention is to provide a method of positioning of plated through-holes (PTH) relative to ball grid array (BGA) pads on an organic laminate carrier so as to equalize stresses at the pads and thereby increasing the reliability of electrical connections due to a reduction in thermal deformation caused by a mismatch in the coefficient or extent of thermal expansion (CTE) between the plated through-holes and the organic chip carrier material.

BRIEF DESCRIPTION OF THE DRAWINGS

Reference may now be had to the following detailed description of a preferred embodiment of the invention, taken in conjunction with the accompanying drawings; in which:

FIG. 1 illustrates a diagrammatic plan view showing a presently employed conventional placement of plated through-holes relative to BGA pads on an organic laminate carrier;

FIG. 2 illustrates a diagrammatic plan view illustrating the symmetrical arrangement of the plated through-holes relative to the pads on the organic laminate carrier as disclosed by the present invention;

FIG. 3 illustrates a diagrammatic perspective view of a portion of an organic laminate chip carrier pursuant to the current state-of-the-art, representing the positioning of plated through-holes (PTH) relative to the location of the BGA pads;

DETAILED DESCRIPTION OF A PREFERRED EMBODIMENT

Figure 4A:
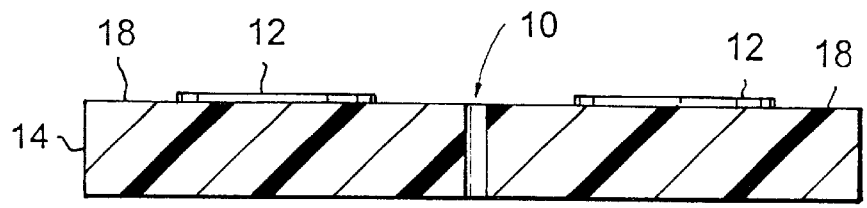
FIGS. 4(a) and (b) illustrate, respectively, sectional views through the organic laminate carrier of FIG. 3, taken along line 4—4 indicating the location of the plated through-hole relative to the pads prior to deformation, and the effects of thermal deformation during reflow of solder.

Referring in detail to the drawings, FIG. 1 generally diagrammatically illustrates a presently employed conventional pattern of random placement of plated through-holes (PTH) 10 relative to pads 12 on a substrate 14, such as an organic laminate chip carrier, wherein the pads 12 are adapted to have ball grid arrays (BGA) or solder balls arranged thereon for electrical interconnects.

As indicated in FIG. 1, the random distribution of the plated through-holes 10 represents these to be at different distances from the respective BGA pads 12, which as illustrated hereinbelow, leads to temperature-induced stresses or strains tending to adversely affect the electrical connections at the pads 12 and resultingly compromising the reliability thereof.

In contrast with the foregoing, as illustrated in FIG. 2 of the drawings, the invention contemplates positioning the plated through-holes 10 in a symmetrical placement or uniform spacing relative to the pads 12, thereby providing for an even and reduced stress distribution at the various BGA pads 12.

As shown diagrammatically in FIGS. 3, 4a, 4b, 5a and 5b, in FIG. 3 is a perspective view representative of an organic laminate chip carrier 14 having pads 12 of copper material positioned on the organic laminate chip carrier, wherein the pads are for (BGA) ball grid array 16, as shown. The pads 12 are essentially equidistantly spaced in an array on the organic laminate chip carrier 14, the latter of which contains at least two plated through-holes (PTH) 10 wherein, as shown in the cross-sectional representation in FIGS. 4(a) and (b) along line 4—4 in FIG. 3, one of the plated through-holes 10 is equidistantly located between two of the pads 12, whereas as illustrated in the sectional representation of line 5—5 in FIG. 3, representing FIGS. 5(a) and 5(b), a plated through-hole 10 is located in closer proximity to one of the pads 12 on the organic laminate chip carrier 14.

Figure 4B:
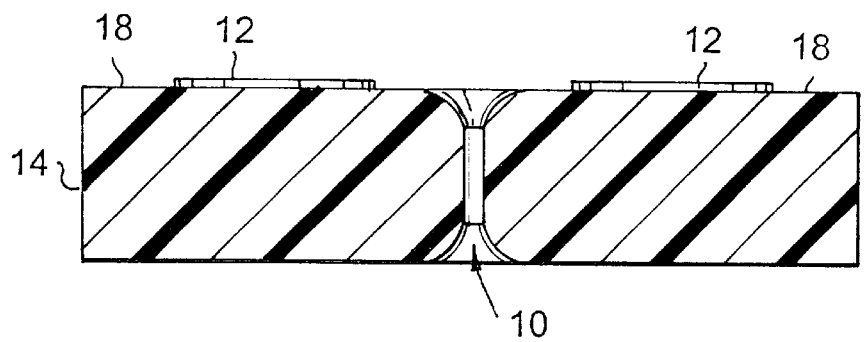
Figure 5A:
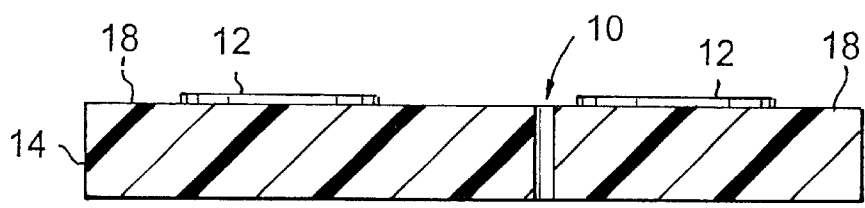
FIGS. 5(a) and (b) illustrate, in a representative similar to FIGS. 4(a) and (b), sectional views taken along line 5—5 in FIG. 3 showing the section prior to and subsequent to thermal deformation during solder reflow.

As indicated in FIGS. 4(a) and 5(a) showing the organic laminate carrier 14 prior to being thermally deformed during solder reflow, FIG. 4(a) shows the plated through-hole 10 equidistantly located between two pads 12 on the upper surface 18 of the organic laminate carrier 14. During reflow which produces thermal deformation or swelling of the organic laminate carrier 14, as shown in FIG. 4(b), the deformation takes primarily place at the location of the plated through-hole (PTH) 10 and extend radially therefrom, whereby the stresses are equally dispersed towards the pads 12, and there is no appreciable distortion or strain at the pads 12 which have the solder balls thereon. As a result, this maintains the integrity and reliability of the electrical connections at those pads 12.

Figure 5B:
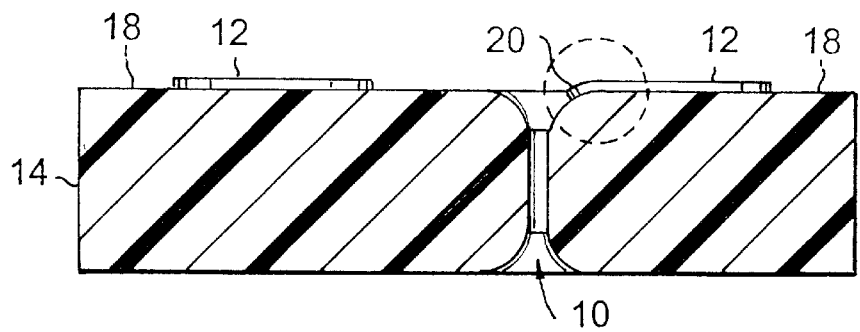

To the contrary, as illustrated in FIGS. 5(a) and 5(b) of the drawings, representing the configuration in which the plated through-hole 10 is located in closer proximity to one of the pads 12, the edge 20 of the pad 12 which is nearer the plated through-hole 10, as shown by the circle, is distorted or bent due to the thermal deformation of the carrier 14, so as to possibly cause damage to the electrical connect at that location, thereby adversely affecting the reliability of the electronic circuitry, and possibly leading to failure of the entire system.

Figure 6:
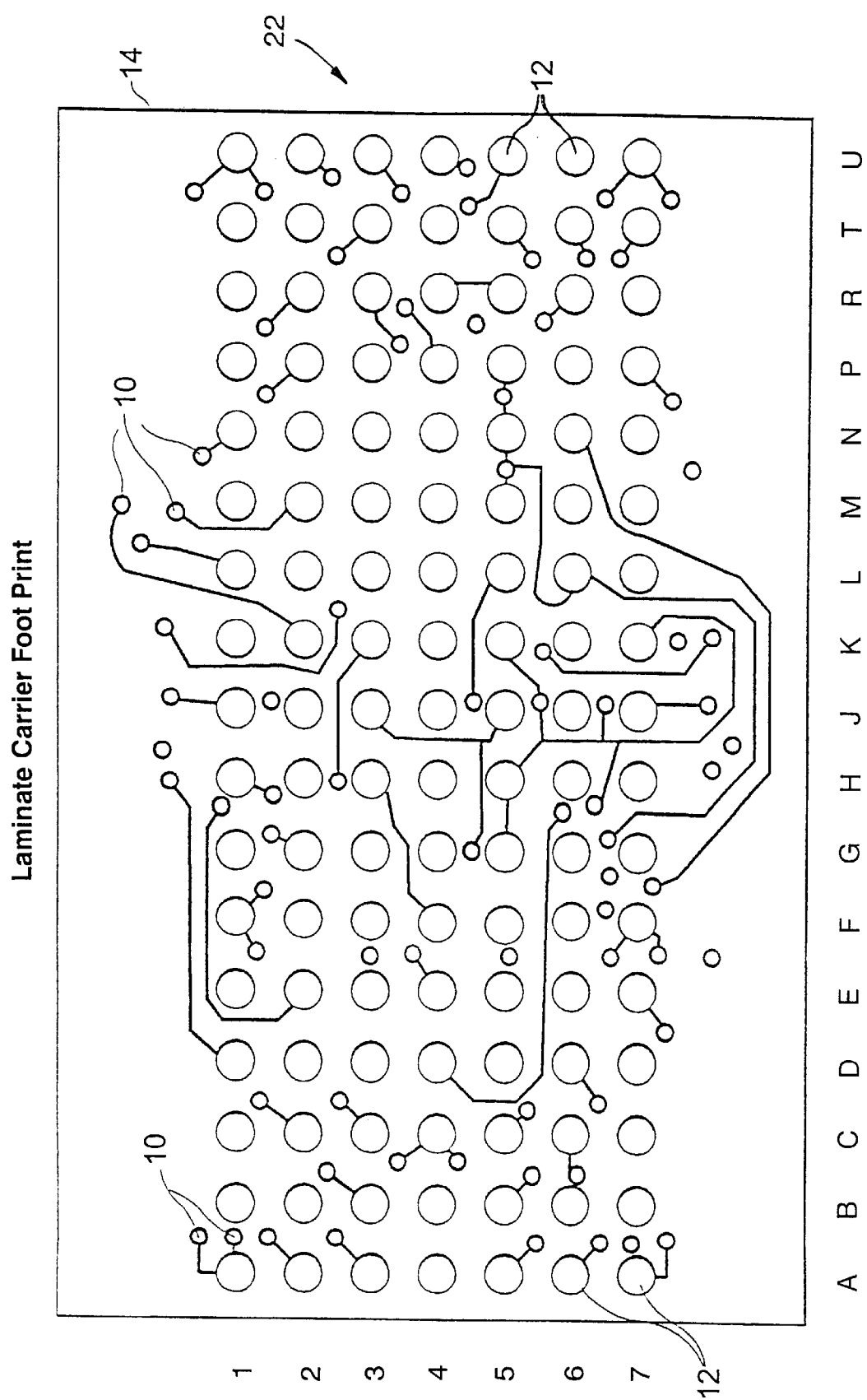
FIG. 6 illustrates a laminate carrier footprint of a printed circuit board.
Figure 7:
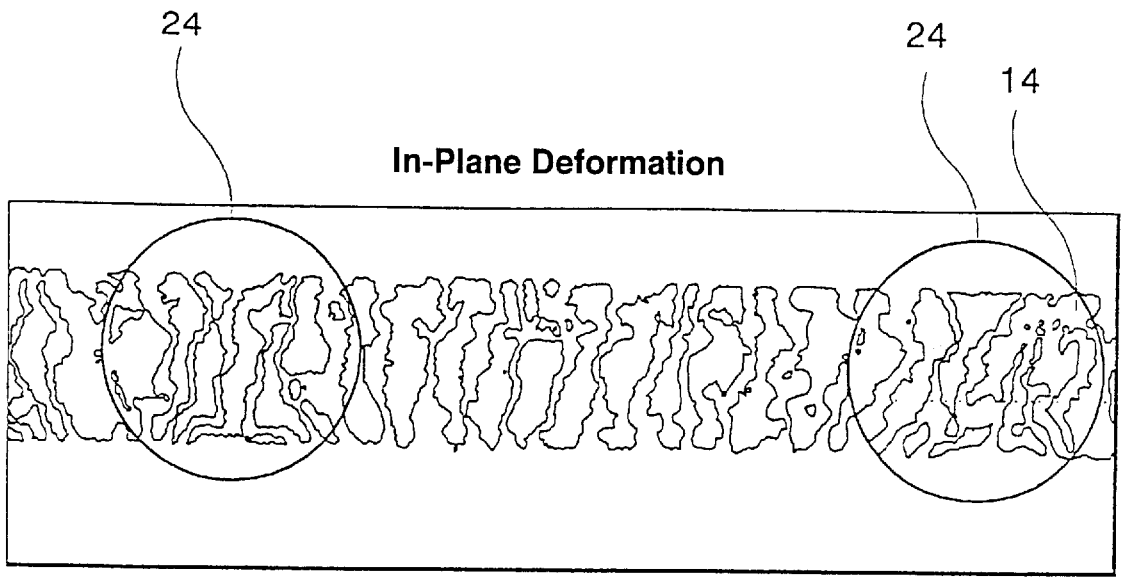
FIGS. 7 and 8 illustrate in cross-sectional views, respectively, a Moire analysis of in-plane thermal deformation of in-plane and out-of-plane deformation of the carrier caused by mismatch in extent of thermal expansion (CTE) between copper-plated through-holes (PTH) and the organic material laminate of the circuit board.
Figure 8:
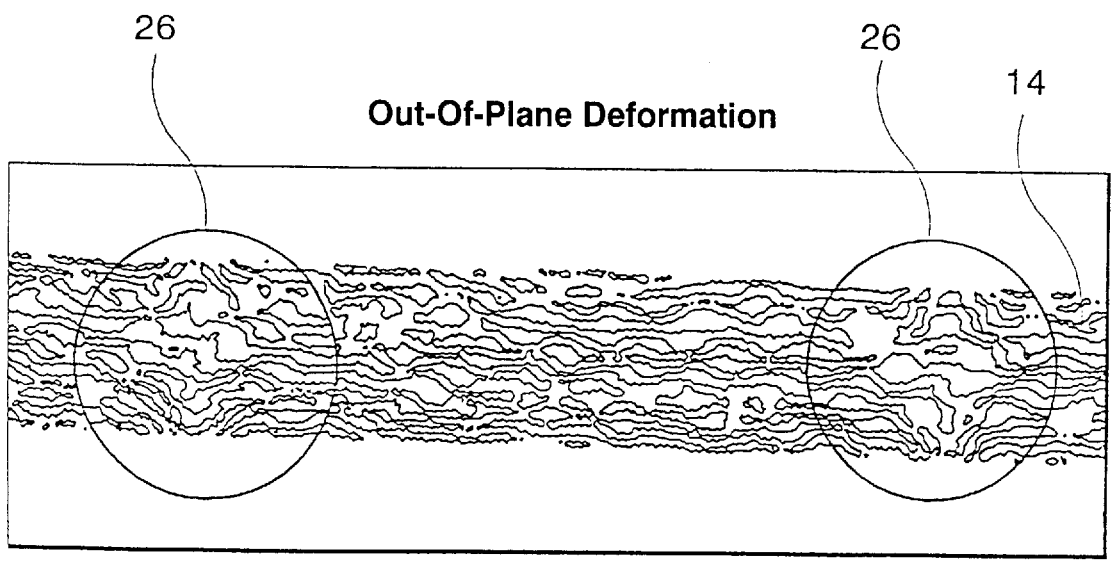
Figure 9:
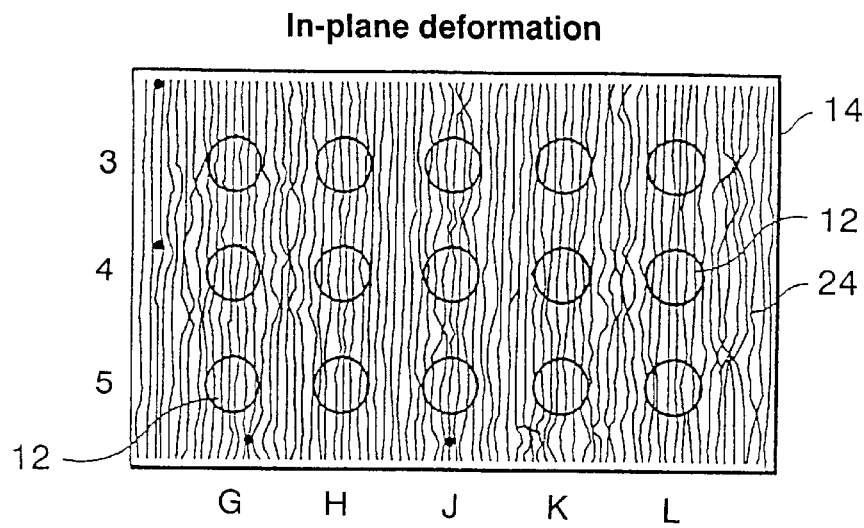
FIGS. 9 and 10 illustrate in plan views, respectively, in-plane deformation and out-of-plane deformation of the printed circuit board of FIG. 6.
Figure 10:
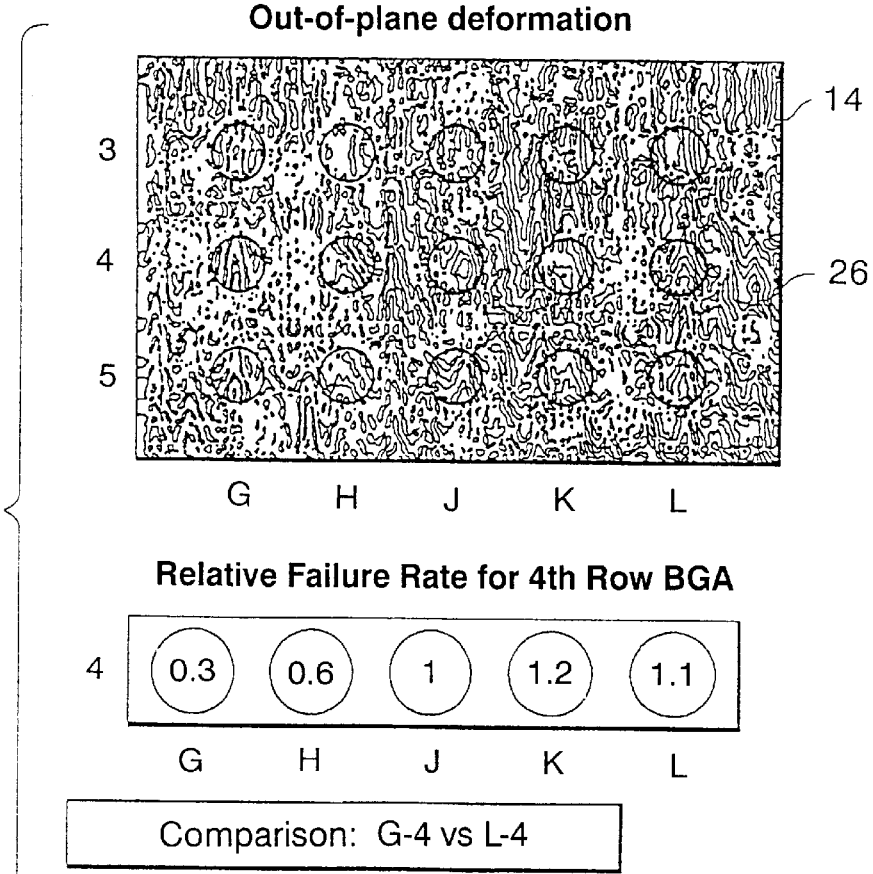

Reverting to an analysis of the effect of the plated through-holes 10 on the pads 12 due to deformation of the carrier 14, through cross-section Moire analysis, as shown in FIG. 6 of the drawings, there is illustrated a laminate carrier footprint 22. As indicated, during reflow leading to the thermal deformation of the organic laminate chip carrier 14, as a result of a mismatch in the coefficient or extent of thermal expansion (CTE) between the copper-plated (PTH) 10 and that of the laminate 14, both the in-plane 24 and out-of-plane thermal deformations 26 are encountered in that particular region, as shown in FIGS. 7 and 8 of the drawings in cross-sectionally enlarged views, and also in the plan views of FIGS. 9 and 10 relative to failure rates for in-plane deformation and out-of-plane deformation of the organic laminate carrier 14 for symmetrical and non-uniform spacings of plated through-holes 10.

Figure 11:
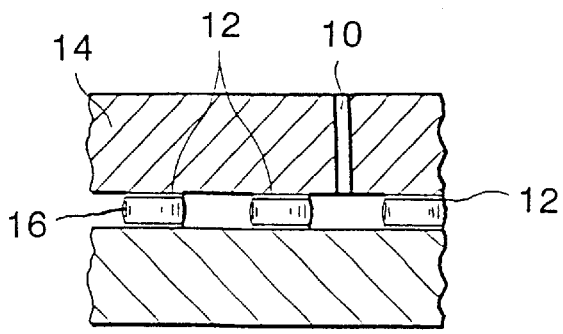
FIGS. 11 and 12 illustrate, respectively, on enlarged scales, the plastic strain encountered by the printed circuit board as a function of the distance δ between the location of the plated through-hole (PTH) and that of the BGA pad, FIG. 12 being a further enlarged fragmentary detail of FIG. 11.
Figure 12:
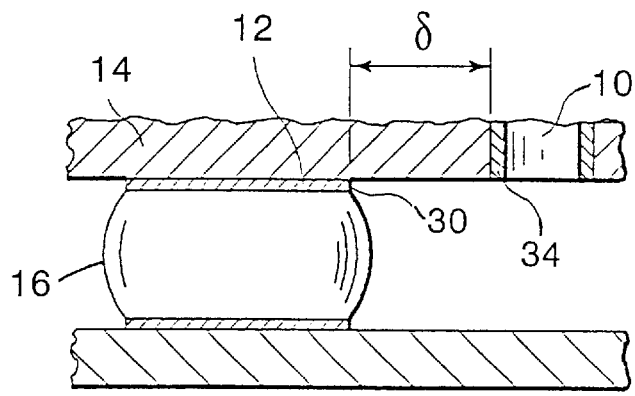
Figure 13:
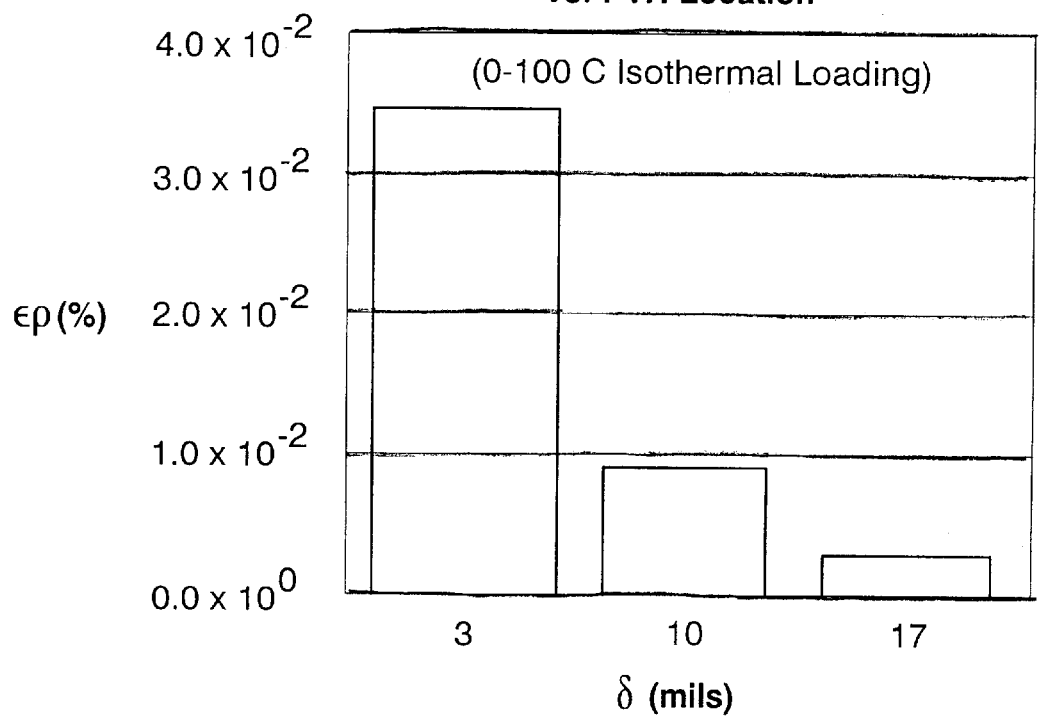
FIG. 13 illustrates a graph showing the differences of plastic strain as a function of the distance δ between the location of plated through-hole in FIG. 12 and the location of the BGA pad.

As illustrated in FIGS. 11 and 12, respectively showing a section of a carrier, and a fragmentary detail portion on a larger scale illustrative of a cross-sectional representation of the location of a BGA pad 12 and a plated through-hole (PTH) 10, the symbol δ represents the distance between the edge 30 of the pad 12 which is proximate the adjacent edge 34 of the closest PTH. Accordingly, as indicated in FIG. 13, graphically representing plastic strain versus PTH location between 0 and 100° C. isothermal loading, the closer the proximity between the PTH and the pad as measured, the higher is the plastic strain in the organic laminate chip carrier 14.

Accordingly, by optimizing the spacings between the plated through-holes (PTHs) 10 and the BGA pads 12 so as to provide a more uniformly arrayed distribution or distances therebetween, there is obtained a reduction in thermal stress peaks in comparison with previously more closely spaced BGA pads and PTHS, thereby avoiding or reducing to tenable levels the strains at the edges of the BGA pads, and resultingly increasing the reliability of the connects and operative life expectancy of the entire system.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

Having thus described our invention, what we claim as new, and desire to secure by Letters Patent is:

1. A chip carrier comprising:
   (a) a substrate constituted of an organic laminate material having an upper surface;
   (b) at least two contact pads for electrical interconnects being located in predetermined spaced relationship on said upper substrate surface; and
   (c) at least one plated through-hole extending substantially through said substrate between said upper surface and a lower surface of said substrate, said at least one plated through-hole being located substantially equidistantly spaced between said at least two contact pads, said organic laminate material having a substantially different coefficient of thermal expansion than said at least one plated through-hole so as to cause said substrate to expand at a greater rate at the locations of said contact pads than at the location of said at least one plated through-hole, and whereby the equidistant spacing of said at least one plated through-hole from said at least two contact pads reduces in-plane and out-of-plane generated thermal stresses and strains in the substrate in the regions of each of said contact pads.

2. A chip carrier as claimed in claim 1, wherein said at least one plated through-hole is copper-plated.

3. A chip carrier as claimed in claim 1, wherein solder elements are disposed on said contact pads.

4. A chip carrier as claimed in claim 3, wherein said at least two contact pads are constituted of copper, said solder elements comprising solder balls.

5. A chip carrier as claimed in claim 1, wherein a plurality of said contact pads are arranged in spaced relationship about the upper surface of said substrate so as to form an array of said contact pads; and a plurality of said plated through-holes are formed in said substrate intermediate said contact pads in substantially equidistant spacings between adjacently located of each of said array of contact pads.

6. A chip carrier as claimed in claim 5, wherein said plated through-holes are arranged in said substrate so as to effectively reduce said thermal stresses and strains in said substrate at the locations of said contact pads so as to eliminate thermally-induced deformations of said substrate in the regions of said contact pads.

7. A method of forming a chip carrier from a substrate constituted of an organic laminate material having an upper surface;
   (a) locating at least two contact pads for electrical interconnects in spaced relationship on said upper substrate surface, and
   (b) forming at least one plated through-hole extending substantially through said substrate between said upper surface and a lower surface of said substrate, said at least one plated through-hole being located substantially equidistantly spaced between said at least two contact pads, said organic laminate material having a substantially different coefficient of thermal expansion than said at least one plated through-hole so as to cause said substrate to expand at a greater rate at the locations of said contact pads than at the location of said at least one plated through-hole, and whereby the equidistant spacing of said at least one plated through-hole from said at least two contact pads reduces in-plane and out-of-plane generated thermal stresses and strains in the region of each of said contact pad.

8. A method as claimed in claim 7, wherein said at least one plated through-hole is copper-plated.

9. A method as claimed in claim 7, wherein solder elements are disposed on said contact pads.

10. A method as claimed in claim 9, wherein said at least two contact pads are constituted of copper, said solder elements comprising solder balls.

11. A method as claimed in claim 7, wherein a plurality of said contact pads are arranged in spaced relationship about the upper surface of said substrate so as to form an array of said contact pads; and a plurality of said plated through-holes are formed in said substrate intermediate said contact pads in substantially equidistant spacings between adjacently located of each of said array of contact pads.

12. A method as claimed in claim 11, wherein said plated through-holes are arranged in said substrate so as to effectively reduce said thermal stresses and strains in said substrate at the locations of said contact pads so as to eliminate thermally-induced deformations of said substrate in the regions of said contact pads.

\* \* \* \* \*

UNITED STATES PATENT AND TRADEMARK OFFICE
CERTIFICATE OF CORRECTION

PATENT NO. : 6,291,776 B1
DATED : September 18, 2001
INVENTOR(S) : V. Markovich et al.

It is certified that error appears in the above-identified patent and that said Letters Patent is hereby corrected as shown below:

Title page,
Item [74], *Attorney, Agent or Firm*, delete -- Ronald A. Kaschak --

Column 2,
Line 2, "Chobot, et al." should begin new paragraph.

Column 4,
Line 51, "carrier 14" should read -- carrier 12 --

Column 5,
Line 55, "PTHS" should read -- PTHs --

Signed and Sealed this

First Day of October, 2002

Attest:

Attesting Officer

JAMES E. ROGAN
*Director of the United States Patent and Trademark Office*